US011499998B2

(12) United States Patent
Khaddam-Aljameh et al.

(10) Patent No.: US 11,499,998 B2
(45) Date of Patent: Nov. 15, 2022

(54) CURRENT SENSOR

(71) Applicant: International Business Machines Corporation, Armonk, NY (US)

(72) Inventors: Riduan Khaddam-Aljameh, Zurich (CH); Pier Andrea Francese, Adliswil (CH)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 740 days.

(21) Appl. No.: 16/524,681

(22) Filed: Jul. 29, 2019

(65) Prior Publication Data
US 2021/0033648 A1 Feb. 4, 2021

(51) Int. Cl.
*G01R 19/255* (2006.01)
*H03L 5/00* (2006.01)
*H03K 21/38* (2006.01)
*G06F 17/16* (2006.01)
*G11C 13/00* (2006.01)
*G06F 30/30* (2020.01)

(52) U.S. Cl.
CPC ........... *G01R 19/255* (2013.01); *G06F 17/16* (2013.01); *G06F 30/30* (2020.01); *G11C 13/004* (2013.01); *G11C 13/0004* (2013.01); *G11C 13/0069* (2013.01); *H03K 21/38* (2013.01); *H03L 5/00* (2013.01)

(58) Field of Classification Search
CPC .. H03B 5/1215; H03B 5/1271; H03B 5/1237; H03B 5/1206; H03B 5/12; H03B 5/08; H03B 1/00; H03L 7/099; H03L 7/0991; H03L 7/0992
See application file for complete search history.

(56) References Cited

U.S. PATENT DOCUMENTS

| | | | | |
|---|---|---|---|---|
| 5,909,150 | A * | 6/1999 | Kostelnik | H03L 7/0995 331/8 |
| 8,212,599 | B2 * | 7/2012 | Bhuiyan | H03K 5/1515 327/164 |
| 9,903,892 | B2 * | 2/2018 | Zhang | H03M 1/0607 |
| 10,034,347 | B2 | 7/2018 | Yamauchi | |
| 2018/0267480 | A1 | 9/2018 | Mahajan et al. | |
| 2018/0269785 | A1 | 9/2018 | Torres | |
| 2018/0364785 | A1 * | 12/2018 | Hu | G11C 13/004 |

OTHER PUBLICATIONS

Burr et al., "Neuromorphic computing using non-volatile memory," Advances in Physics: X 2.1 (2017): 89-124.
(Continued)

*Primary Examiner* — Diana J. Cheng
(74) *Attorney, Agent, or Firm* — Cantor Colburn LLP; Daniel Morris

(57) ABSTRACT

Embodiments of the invention are directed to a current sensor that includes a current controlled oscillator circuit configured to receive an input current and to provide an output signal having an output frequency which is dependent on the input current. The current sensor further includes a feedforward circuit configured to adapt a reference voltage of the current controlled oscillator in dependence on an instantaneous current value of the input current.

18 Claims, 6 Drawing Sheets

(56) References Cited

OTHER PUBLICATIONS

Kim et al., "Analysis and Design of Voltage-Controlled Oscillator Based Analog-to-Digital Converter," IEEE Transactions on Circuits and Systems I: Regular Papers 57.1 (2009): 18-30.

Prabha et al., "A Highly Digital VCO-Based ADC Architecture for Current Sensing Applications," IEEE Journal of Solid-State Circuits 50.8 (2015): 1785-1795.

Wang et al., "A CMOS current-controlled oscillator and its applications," Proceedings of the 2003 International Symposium on Circuits and Systems, ISCAS'03.., vol. 1, IEEE, 2003, 4 pages.

Zhao et al., "CMOS Current-controlled Oscillators," 2007 IEEE International Symposium on Circuits and Systems, IEEE, 2007, pp. 929-932.

* cited by examiner $V_{Ref}(I_{In}) = V_{REF0} + \alpha \times I_{In};$

300

400

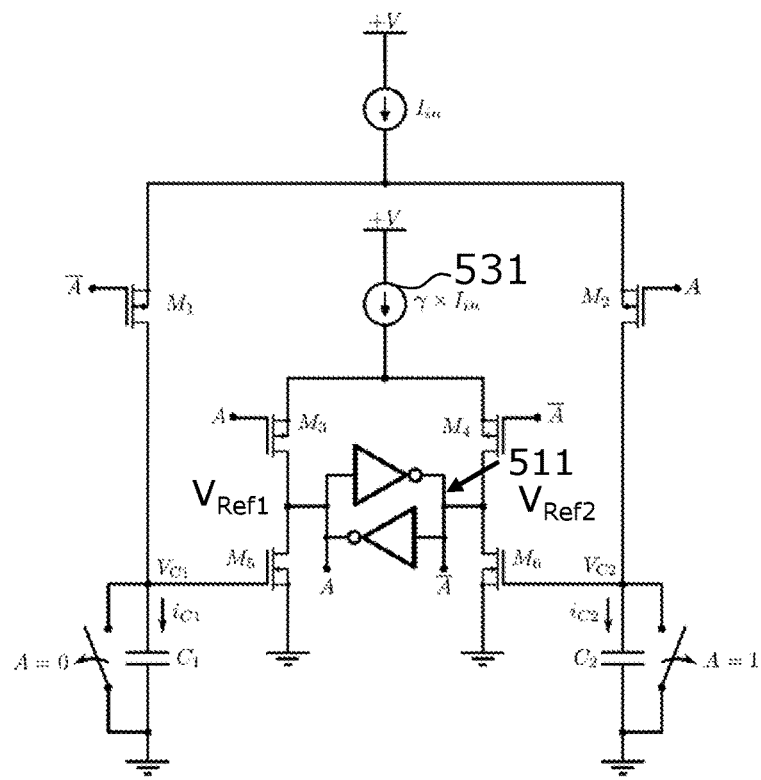
FIG. 5        500
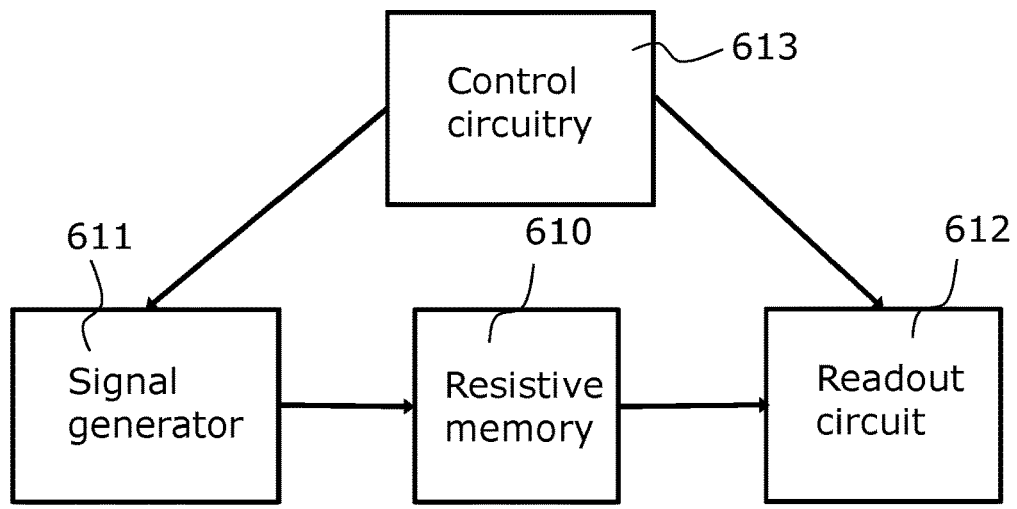
600
FIG. 6

900

CURRENT SENSOR

BACKGROUND

The present invention relates to a current sensor. The invention further concerns a related method and a related design structure.

Current sensors may be applied for a plurality of applications, e.g. in image sensing, automotive applications as well as memcomputing approaches. Current sensors may be in particular embodied as charge quantization circuits to quantify unit charges. A unit charge may be defined as a predefined amount of charge.

Such a charge quantization may be performed by circuits comprising analog-to-digital converters which integrate the current on a capacitor and convert the resulting voltage by means of the analog-to-digital converter.

Another approach for charge quantization are current sensors comprising a current-controlled oscillator (CCO). According to such an approach, the CCO emits pulses once a unit charge has been detected. One problem of such an approach are non-linearities of the current-to frequency conversion.

SUMMARY

According to a first aspect, the invention is embodied as a current sensor comprising a current controlled oscillator circuit configured to receive an input current and to provide an output signal having an output frequency which is dependent on the input current. The current sensor further comprises a feedforward circuit configured to adapt a reference voltage of the current controlled oscillator in dependence on an instantaneous current value of the input current.

According to another aspect, the invention is embodied as a method for performing a charge quantization. The method comprises steps of receiving, by a current controlled oscillator circuit, an input current and adapting, by a feedforward circuit, a reference voltage of the current controlled oscillator in dependence on an instantaneous current value of the input current. The method comprises further steps of providing, by the current controlled oscillator circuit, an output signal having an output frequency which is dependent on the input current.

According to another aspect a design structure is provided. The design structure is tangibly embodied in a machine readable medium for designing, manufacturing, or testing an integrated circuit. The design structure comprises a current controlled sensor according to the first aspect.

Embodiments of the invention will be described in more detail below, by way of illustrative and non-limiting examples, with reference to the accompanying drawings.

BRIEF DESCRIPTION OF THE DRAWINGS

FIG. 5 is a simplified schematic block diagram of a current sensor according to another embodiment of the invention comprising a latch-based current controlled oscillator;

FIG. 6 is a simplified schematic block diagram of a device for performing a multiplication of a matrix with a vector according to an embodiment of the invention;

DETAILED DESCRIPTION

Figure 1:
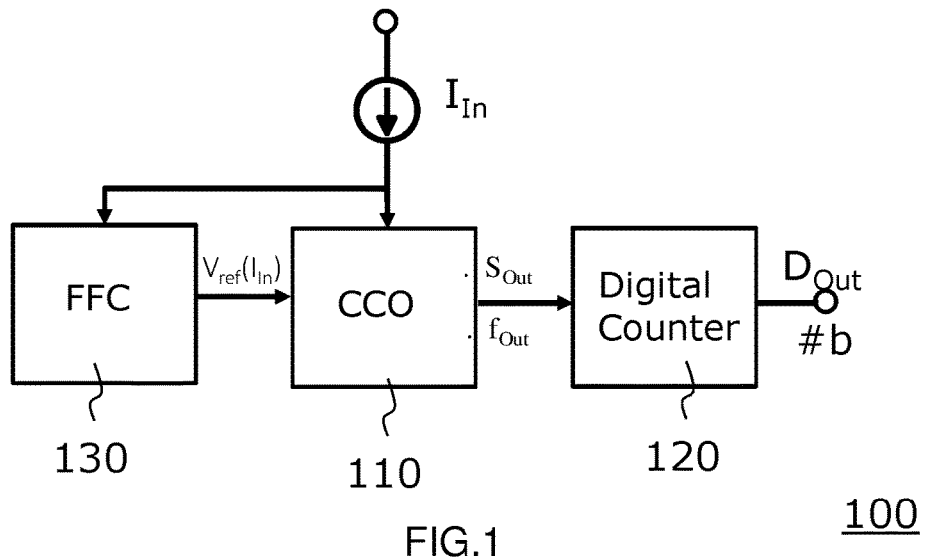
FIG. 1 is a simplified schematic block diagram of a current sensor according to an embodiment of the invention.

FIG. 1 is a simplified schematic block diagram of a current sensor 100 according to an embodiment of the invention. The current sensor 100 comprises a current controlled oscillator circuit 110 which is configured to receive an input current $I_{In}$, and to provide an output signal $S_{out}$ having an output frequency $f_{out}$ which is dependent on the input current $I_{In}$. The output signal $S_{out}$ is provided to a counter circuit 120 configured to convert the output frequency $f_{out}$ into a digital signal $D_{Out}$, namely a counter value #b. The current sensor 100 comprises a feedforward circuit 130 which is configured to adapt a reference voltage $V_{Ref}$ of the current controlled oscillator 110 in dependence on the instantaneous current value of the input current $I_{In}$. More particularly, the feedforward circuit (FFC) 130 receives the instantaneous current value of the input current $I_{In}$ as input and uses it to adapt the reference voltage $V_{Ref}$. Hence the reference voltage $V_{Ref}$ is dependent on $I_{in}$.

According to embodiments of the invention the feedforward circuit 130 introduces a linear or quasi linear, current dependent decay factor into the reference voltage of the current controlled oscillator 110. This facilitates a reduction or even elimination of the delay in the frequency-current relation equation and subsequently renders it linear. Hence the approach employed according to embodiments of the invention may be considered as a feedforward approach in a control system.

The current sensor 100 may be in particular embodied as charge quantization circuit configured to perform a charge quantization of the input current $I_{In}$. For this the current sensor 100 may comprise e.g. one or more integration capacitors which are charged by the input current and de-charged during a plurality of charge/discharge cycles. The charge quantization circuit 100 may then provide a pulse signal per charge/discharge cycle to the counter circuit 120 and the counter circuit 120 may then count the plurality of charge/discharge cycles.

Figure 2:
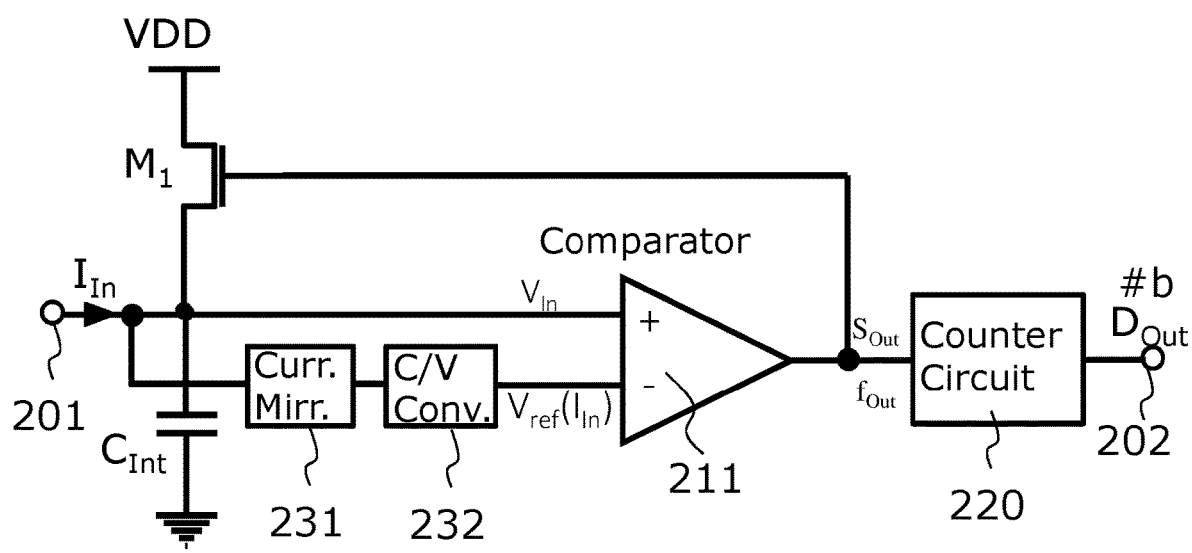
FIG. 2 is a simplified schematic block diagram of a current sensor according to an embodiment of the invention.

FIG. 2 is a simplified schematic block diagram of a current sensor 200 according to an embodiment of the invention. The current sensor 200 comprises an input port 201 for receiving and sensing an input current $I_{In}$. The current sensor 200 is in particular embodied for performing a charge quantization of the input current $I_{In}$. The current sensor 200 comprises an integration capacitor $C_{Int}$ which is coupled between the input port 201 and ground as well as a transistor switch $M_1$ which is coupled between the input port 201 and a supply voltage VDD. The current sensor 200 comprises a comparator 211, having a positive input which receives an input voltage $V_{In}$ and an inverting input which receives a reference voltage $V_{Ref}$. The current sensor 200 comprises a current mirror 231 and a current-to-voltage converter 232. The current mirror 231 mirrors the input current $I_{In}$ to the current-to-voltage converter 232. The current-to-voltage converter 232 is configured to adapt the reference voltage $V_{Ref}$ in a predefined manner in dependence on the input current $I_{In}$. According to embodiments the current-to-voltage converter 232 may be configured to add a current-dependent value dependent on the input current to a base reference voltage. The current-to-voltage converter 232 provides as output the reference voltage $V_{Ref}$ which is dependent on the input current $I_{In}$ and hence denoted as $V_{Ref}$ ($I_{In}$). The comparator 211 may be in particular embodied as self-resetting comparator. The comparator 211 provides an output signal $S_{out}$ having an output frequency $f_{out}$ which depends on the input current $I_{In}$ and may be in particular proportional to the input current $I_{In}$. The output signal $S_{out}$ is provided to a counter circuit 220 which converts the output frequency $f_{out}$ into a counter value #b, also denoted as digital output signal $D_{out}$. The counter circuit 220 may be reset at fixed time intervals. During such a reset operation, the comparator input voltage $V_{In}$ is reset to a predefined voltage, in this example to the supply voltage VDD by means of the switching transistor M1. During operation the integration capacitor $C_{Int}$ is charged and discharged in charge/discharge cycles. The input voltage $V_{In}$ of the comparator 211 corresponds to a charge voltage of the integration capacitor $C_{Int}$. More particularly, if the transistor M1 is switched off, the integration capacitor $C_{Int}$ is discharged by the input current $I_{In}$ until it reaches $V_{Ref}$. The time to discharge the input voltage $V_{In}$ is inversely proportional to the input current $I_{In}$. If the input voltage $V_{In}$ reaches $V_{Ref}$, the comparator 211 changes its output signal and the transistor M1 resets the input voltage $V_{In}$ to $V_{DD}$. The period $T_{out}=1/f_{out}$ of the output signal $S_{out}$ may be described as follows:

$$T_{out}I_{In}/C_{Int} \times (V_{DD}-V_{Ref}(I_{In}))+T_{off}; \quad \text{(equation 1)}$$

wherein $T_{Off}$ is the "turn-off time" of the output signal $S_{out}$ of the comparator 211. The turn-off time $T_{Off}$ may include a delay of the comparator 211 as well as a delay of the switching capacitor $M_1$. The turn-off time $T_{Off}$ introduces a current-dependent non-linearity into the system which may dominate the frequency in particular for large input currents. According to embodiments of the invention, the instantaneous current value of the input current $I_{In}$ is forwarded via the current mirror 231 to the current-voltage-converter 232 in order to compensate for the delays of $T_{Off}$.

Figure 3:
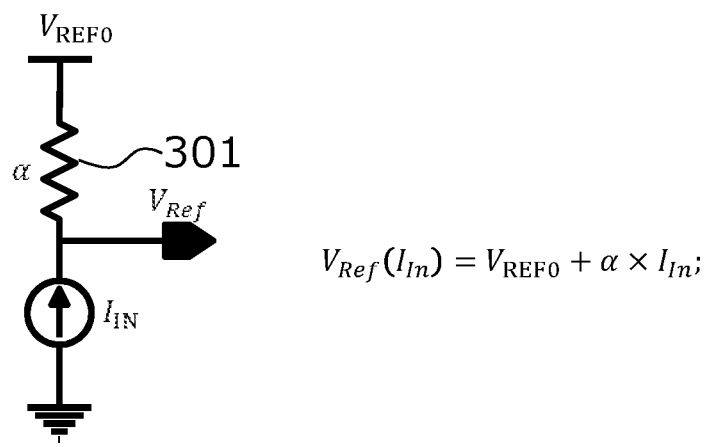
FIG. 3 shows an embodiment of a current-voltage-converter according to aspects of the invention.

FIG. 3 shows an embodiment of a current-to-voltage-converter 300, which represents a more detailed example of the current-to-voltage-converter 232 of FIG. 2.

The current-to-voltage-converter 300 comprises a resistor 301 having a resistance value $\alpha$. The current-to-voltage-converter 300 adds a current-dependent value to a fixed base reference voltage $V_{REF0}$. More particularly, the current-to-voltage-converter 300 provides a reference voltage $V_{Ref}(I_{In})$ to the comparator 211 as follows:

$$V_{Ref}(I_{In})=V_{REF0}+\alpha \times I_{In}; \quad \text{(equation 2)}$$

By introducing this into equation 1, the period $T_{out}$ reads as follows:

$$T_{out} = \frac{C_{Int} \times (V_{DD} - V_{Ref}(I_{In}))}{I_{In}} + T_{OFF} = \quad \text{(equation 3)}$$

$$\frac{C_{Int} \times (V_{DD} - V_{REF0})}{I_{In}} + T_{OFF} - \alpha \times C_{Int};$$

According to embodiments, the resistance value $\alpha$ of the resistor 301 may be chosen as follows:

$$\alpha \times C_{Int}=T_{OFF}; \quad \text{(equation 4)}$$

As a result, the period $T_{out}$ reads as follows:

$$T_{out} = \frac{C_{Int} \times (V_{DD} - V_{REF0})}{I_{In}}; \quad \text{(equation 5)}$$

Accordingly, the output frequency $f_{Out}$ is proportional to the input current $I_{In}$, i.e.

$$f_{Out} \sim I_{In}, \quad \text{(equation 6)}$$

Figure 4:
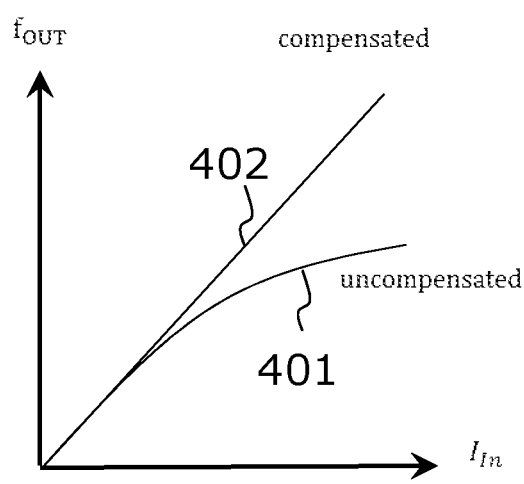
FIG. 4 shows a diagram of the relationship between the input current and the output frequency of current sensors according to embodiments of the invention.

The corresponding effect of the compensation that is achieved by means of the adaption of the reference voltage $V_{Ref}$ in dependence on the input current $I_{In}$ is illustrated in FIG. 4.

More particularly, FIG. 4 shows a diagram of the relationship between the input current $I_{In}$ and the output frequency $f_{Out}$ of current sensors having compensation mechanisms according to embodiments of the invention. The x-axis denotes the input current $I_{In}$ and the y-axis the corresponding output frequency $f_{Out}$. The curve 401 shows the current-to-frequency conversion without the compensation mechanism introduced according to embodiments of the invention, which is non-linear in particular for larger input currents. On the contrary, the curve 402 shows the current-to-frequency conversion with the compensation mechanism introduced according to embodiments of the invention, which is linear even for larger input currents.

FIG. 5 is a simplified schematic block diagram of a current sensor 500 according to another embodiment of the invention.

According to this embodiment, the current controlled oscillator comprises a latch 511 and a feedforward circuit which is configured to control a threshold voltage of the latch in dependence on the input current IIn. The latch 511 forms the central part of the current controlled oscillator and the oscillation is based on set/reset cycles of the latch 511.

The feedforward circuit is established by current mirror 531 which mirrors the input current IIn with a predefined gain $\gamma$ and transistors M3 and M4 via which the threshold voltage of the latch 511 is controlled in dependence of the input current IIn. More particularly, the threshold voltage of the latch 511 can be adapted by adapting reference voltages VRef1 and VRef2 of the latch 511. For an increased current IIn the mirrored current $\gamma \times I_{In}$ increases as well, reducing the trip point of the latch 511. This effect is used to re-linearize the current-frequency characteristic of this oscillator.

The signals VC1 and VC2 are the voltages of small integration capacitors C1 and C2. These capacitors C1 and C2 operate in an alternating fashion. Depending on the latch state A and $\overline{A}$ the input current Iin flows via either iC1 to C1 or iC2 to C2.

FIG. 6 is a schematic block diagram of a device 600 for performing a multiplication of a matrix with a vector. The device 600 comprises a resistive memory 610 having a plurality of resistive memory elements. Furthermore, a signal generator 611 is provided. The signal generator 611 is configured to apply electrical programming signals to the resistive memory elements of the resistive memory 610. The signal generator 611 comprises circuitry for programming the resistive memory cells during data write or programming operations such that a multiplication of a matrix with a vector can be performed. The row lines and column lines may also be denoted as word and bit lines. The signal generator 611 is configured to receive a matrix A as input and to apply programming signals to the resistive memory elements to program conductance values of the resistive memory elements for a matrix-vector multiplication.

The conductance values represent matrix values of the matrix that shall be multiplied with the vector.

In addition, the device 600 comprises a readout circuit 612 configured to read out resistance values of the resistive memory elements during data read operations. The device 600 is configured to apply read out voltages to the rows of the memory crossbar array. The read out voltages represent vector elements of the vector that shall be multiplied with the matrix. The device is further configured to read out current values of columns of the memory array. The current values represent result values of vector elements of a result vector of the multiplication.

The device 600 further comprises control circuitry 613 configured to control the signal generator 611 and the readout circuit 612.

According to embodiments of the invention, a resistive element may be defined as an element whose electrical resistance can be changed by applying an electrical programming signal to the resistive element. The resistive element may be in particular embodied as resistive memory element. The electrical programming signal may be e.g. a current flowing through the resistive memory element, or an electrical voltage applied to the resistive memory element. The current and/or voltage may be e.g. applied to the resistive memory element in the form of pulses. As a result, the electrical resistance of a resistive memory element depends on the history of current that had previously flown through the memory element and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide. These resistive memory elements exhibit good performance in terms of power consumption, integration density potential, retention, and endurance.

The memory 610 may be in particular embodied as phase change memory (PCM). To perform a matrix-vector multiplication, the resistive memory elements, e.g. the PCM cells, are programmed according to embodiments in a kind of write operation. More particularly, the signal generator 11 applies a voltage to the cell via the column lines and row lines such that the resulting programming signal sets the cell to a state (conductance value) that represents a matrix element of the matrix that shall be multiplied with the vector. In a read operation, (lower) read voltages are applied to the row lines. Then the resulting column current values of the column lines are read/measured to obtain the result vector.

Figure 7:
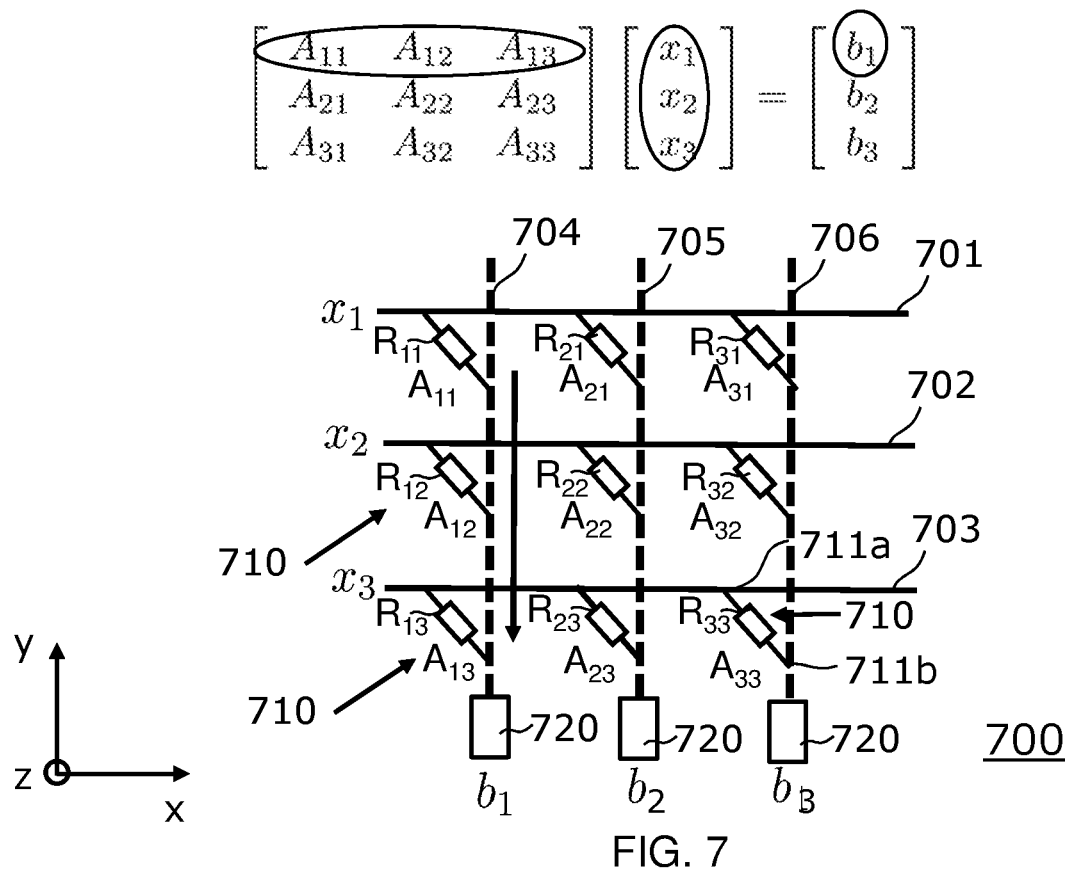
FIG. 7 illustrates an example of a matrix-vector multiplication performed with a device according to an embodiment of the invention.

FIG. 7 illustrates an example of a matrix multiplication according to an embodiment of the invention. The matrix multiplication uses Ohm's law and Kirchhoff's law in a resistive memory crossbar array.

According to the illustrated example, a matrix A of size 3×3 shall be multiplied with a vector x and the result is a product or result vector b:

$$\begin{bmatrix} A_{11} & A_{12} & A_{13} \\ A_{21} & A_{22} & A_{23} \\ A_{31} & A_{32} & A_{33} \end{bmatrix} \begin{bmatrix} x_1 \\ x_2 \\ x_3 \end{bmatrix} = \begin{bmatrix} b_1 \\ b_2 \\ b_3 \end{bmatrix}$$

Accordingly, the matrix A comprises a first column consisting of the matrix elements $A_{11}$, $A_{21}$ and A31, a second column consisting of the matrix elements A12, A22 and A32 and a third column consisting of the matrix elements A13, A23 and A33. The vector x comprises the vector elements x1, x2 and x3.

For such a multiplication of the matrix A with the size 3×3, the resistive memory 610 comprises a memory crossbar array 700 of a corresponding size 3×3.

The memory crossbar array 700 comprises 3 row lines 701, 702 and 703 and three column lines 704, 705 and 706. The three row lines 701, 702 and 703 are arranged above the three column lines 704, 705 and 706 which is indicated by dotted lines. More particularly, the row lines 701, 702 and 703 extend in a first x-y-plane and the three column lines extend in a second x-y plane, wherein the first x-y plane is arranged in the vertical z-direction above the second x-y-plane.

The three row lines 701, 702 and 703 and the three column lines 704, 705 and 706 are connected to each other via vertical junctions 710. The junctions 710 extend in the vertical z-direction between upper cross points 711a of the row lines 701-703 and lower cross points 711b of the column lines 704-706.

Each junction 710 comprises a serial arrangement of a resistive memory element and a transistor. For ease of illustration, the transistors are not shown in FIG. 7.

More particularly, the crossbar array 700 comprises 9 resistive memory elements embodied as PCM cells. The column line 704 comprises resistive memory elements R11, R12 and R13, the column line 705 comprises the memory elements R21, R22 and R23 and the column line 706 the memory elements R31, R32 and R33.

In order to perform the matrix vector multiplication of the above matrix, the signal generator 11 applies programming signals, in particular current pulses, to the resistive memory elements and thereby programs the conductance values for the matrix-vector multiplication.

More particularly, the conductance values of the resistive memory elements represent matrix values of the matrix of the matrix-vector multiplication. Accordingly, the conductance of the resistive memory element R11 is programmed to the matrix value A11, the conductance of the resistive memory element R12 is programmed to the matrix value A12, or more generally the conductance of the resistive memory Rij is programmed to a corresponding matrix value Aij.

Then the readout circuit 612 applies read voltages to the row lines 701, 702 and 703. More particularly, the readout circuit 612 applies a read voltage X1 to the row line 701, a read voltage X2 to the row line 702 and a read voltage X3 to the row line 703. Hence the read voltages represent vector values of the vector of the matrix-vector multiplication.

Furthermore, the readout circuit 612 reads out current values of the column lines 704, 705 and 706. As an example, the readout circuit 612 reads out a current value $b_1$ from the column line 704, which is the sum of three multiplications, namely $b_1 = A_{11}x_1 + A_{12}x_2 + A_{13}x_3$.

Accordingly, the readout circuit 612 reads out a current value b2 from the column line 705 and a current value b3 from the column line 706. The current values represent the result values of the vector elements of the product vector b.

According to embodiments of the invention, the column lines 704, 705 and 706 comprise at its output current sensors 720 for measuring the current values b1 b2 and b3. The current sensors 720 may be embodied e.g. as the current sensors 100, 200 or 500 as described above.

Figure 8:
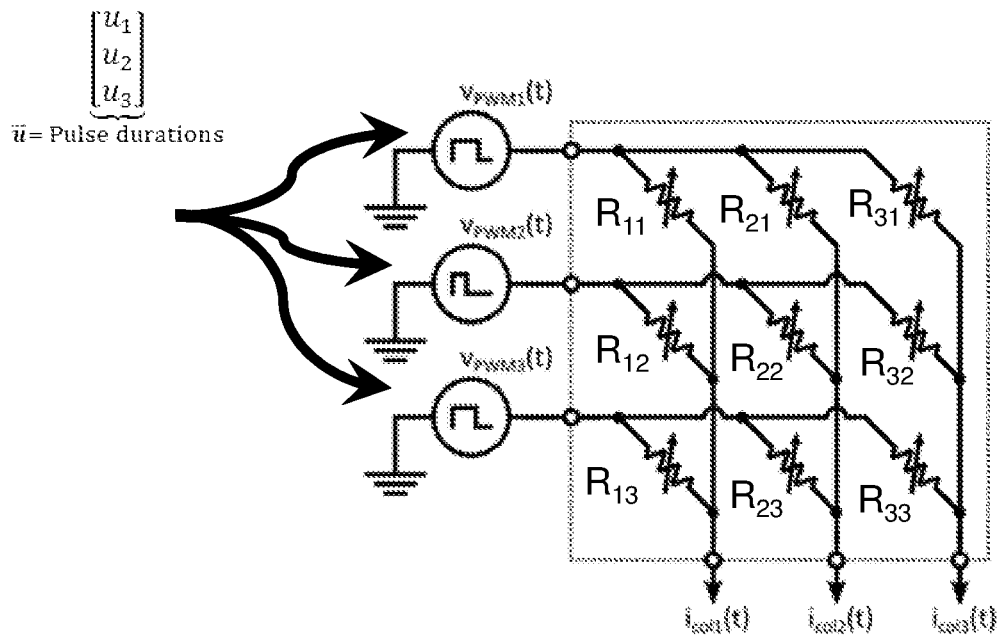
FIG. 8 illustrates the application of read voltages as pulse-width modulated signals to a crossbar array according to an embodiment of the invention.

FIG. 8 illustrates the application of read voltages to a crossbar array according to an embodiment of the invention. According to this embodiment, the application of the input vector happens through read voltage pulse modulation. The elements of an input vector $$\vec{u}$$

are mapped to pulse durations of read pulses. More particularly, the amplitude of the applied read voltages $V_{PWM1}(t)$, $V_{PWM2}(t)$ and $V_{PWM3}(t)$ is fixed, while the width of the read pulses is modulated in dependence on the respective read voltage. This provides the advantage that non-linearities in the current voltage (IV curve) of the resistive elements of the crossbar array are avoided. At the output of the column lines, column current signals $i_{col1}(t)$, $i_{col2}(t)$ and $i_{col3}(t)$ are detected, in particular integrated.

According to embodiments of the invention, the column current signals $i_{col1}(t)$, $i_{col2}(t)$ and $i_{col3}(t)$ may be sensed, in particular quantized, by current sensors as described above, e.g. by the current sensors 100, 200 or 500.

Devices according to embodiments of the invention may establish a non-von-Neumann matrix-vector multiplication accelerator running at O(1) complexity with respect to the dimensions in the multiplied matrix and vector.

The crossbar array of systems according to embodiments of the invention may comprise as resistive elements Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements or a system device, comprising transistors, resistors, capacitors, and/or inductors, jointly emulating a behavior of a resistive memory element.

According to embodiment, the input signal may consist of a digital input vector, which is to be multiplied with the values stored in the resistive elements of the crossbar array. For that the N×1 digital input vector may comprise N numbers with x bits which is converted to an analog quantity to allow the O(1) complexity style multiplication.

This may be implemented according to embodiments in several ways.

According to an embodiment, devices according to embodiments of the invention may be configured to apply the read voltages as pulse-width-modulated signals to the row lines of the crossbar array as shown in FIG. 8. Using pulse-width-modulation (PWM), the x bit input values are converted to pulses of duration 0 to $2^{(x-1)}$ times a clock cycle. The currents to be measured in the PWM case are non-constant and vary with time.

According to another embodiment, devices according to embodiments of the invention may be configured to apply the read voltages as binary read pulse vectors to the row lines of the crossbar array. According to such an embodiment, the devices may comprise in particular an asynchronous counter circuit.

Using binary D/As the x bit input value can be mapped to a sequence of x binary read pulse vectors which are applied to the crossbar array from which x currents are read, digitized and added thus yielding the result of the matrix-vector multiplication. Each current quantized per sequence is a DC quantity and does not change during digitization.

Figure 9:
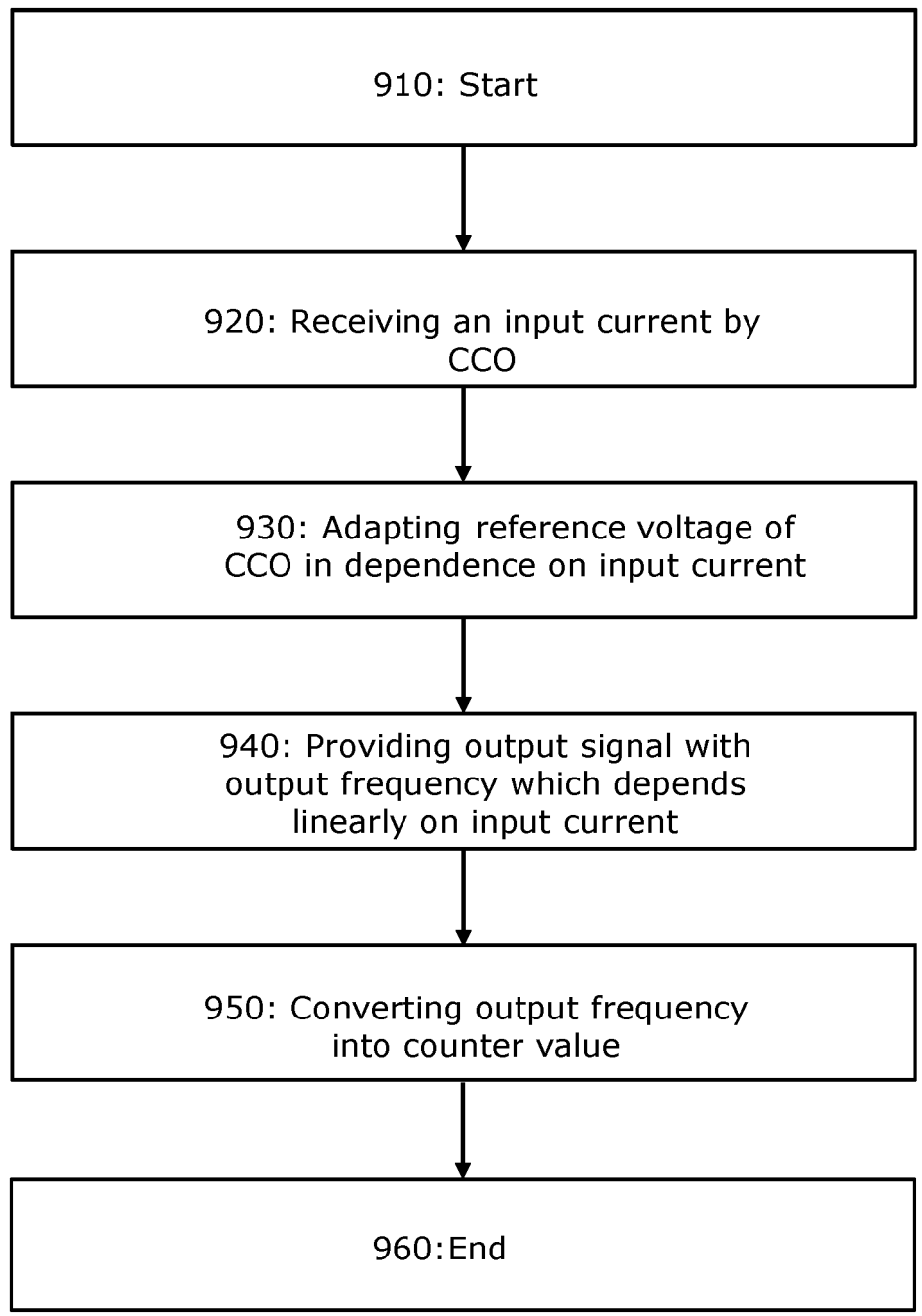
FIG. 9 shows a flow chart of methods steps of a method for performing a matrix-vector multiplication of a matrix with a vector.

FIG. 9 shows a flow chart of methods steps of a method for performing a charge quantization. The method may be performed e.g. by the current sensor 100 and is in the following described with reference to the components of the current sensor 100.

At a step 910, the method starts.

At a step 920, the current controlled oscillator circuit 110 receives an input current IIn.

At a step 930, the feedforward circuit 130 adapts a reference voltage of the current controlled oscillator in dependence on the instantaneous current value of the input current.

At a step 940, the current controlled oscillator circuit 110 provides an output signal having an output frequency which is dependent on the input current.

At a step 950, the counter circuit 120 converts the output frequency into a counter value, e.g. by counting the number of pulses provided by the current controlled oscillator.

At a step 960, the method ends.

Figure 10:
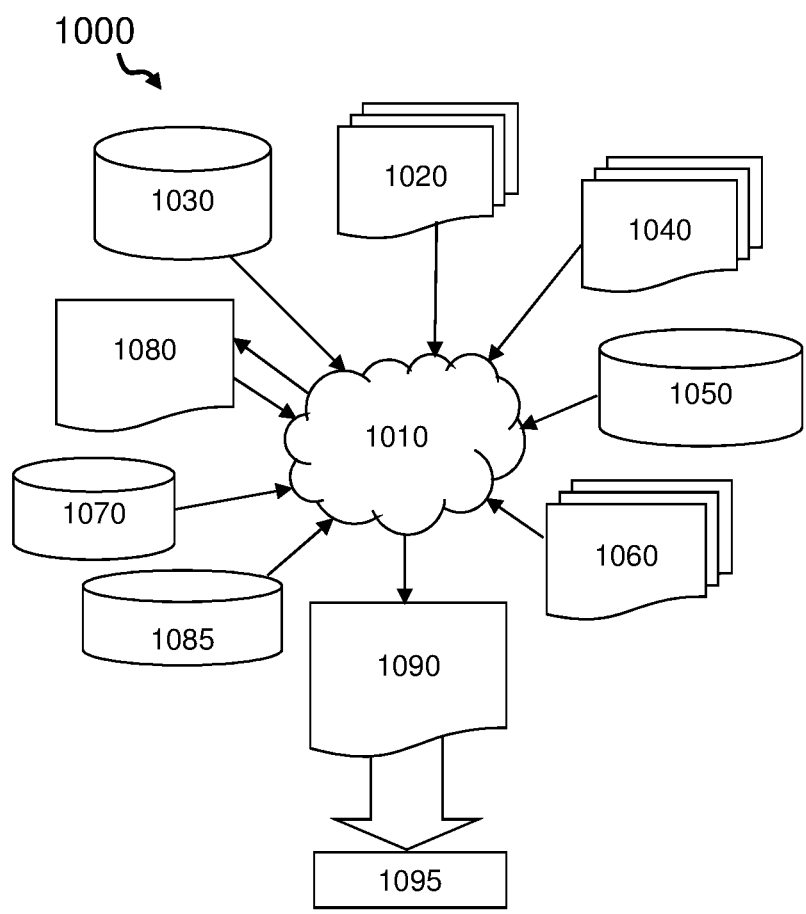
FIG. 10 shows a block diagram of an exemplary design flow.

FIG. 10 shows a block diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above and shown e.g. in FIGS. 1-8. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that can be processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/ designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 1-17. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 can employ and incorporate hardware and/or software modules for synthesizing, translating, or otherwise processing a design/simulation functional equivalent of the components, circuits, devices, or logic structures shown in FIGS. 1-10 to generate a Netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including Netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1020, design structure 1090 can include one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 1090 may comprise a compiled, executable HDL simulation model that functionally simulates the devices shown in FIGS. 1-8.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 1090 may then proceed to a stage 1095 where, for example, design structure 1090: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

It will be understood that those skilled in the art, both now and in the future, may make various improvements and enhancements which fall within the scope of the claims which follow.

What is claimed is:

1. A current sensor comprising:
    a current controlled oscillator circuit configured to receive an input current and to provide an output signal having an output frequency which is dependent on the input current; and
    a feedforward circuit configured to adapt a reference voltage of the current controlled oscillator by adding a current dependent factor that scales linearly with an instantaneous current value of the input current to the reference voltage.

2. A current sensor according to claim 1, wherein the current sensor is configured to feed the output signal of the current controlled oscillator to a counter circuit, the counter circuit being configured to convert the output frequency into a counter value.

3. A current sensor according to claim 1, wherein the current dependent factor is configured to adapt the reference voltage with a gain that cancels out delay factors between the input current and the output frequency.

4. A current sensor according to claim 2, wherein:
    the current controlled oscillator is configured to perform a plurality of charge/discharge cycles of one or more integration capacitors; and
    the counter circuit is configured to count the plurality of charge/discharge cycles of the one or more integration capacitors.

5. A current sensor according to claim 4, wherein the current controlled oscillator comprises a comparator configured to compare a charge voltage of the one or more integration capacitors with the reference voltage.

6. A current sensor according to claim 1, wherein the feedforward circuit comprises a current mirror for mirroring the input current.

7. A current sensor according to claim 1, wherein the feedforward circuit comprises a current-to-voltage converter configured to adapt the reference voltage by adding the current dependent factor to a base reference voltage.

8. A current sensor according to claim 1, wherein:
    the current controlled oscillator comprises a latch; and
    the feedforward circuit is configured to control a threshold voltage of the latch in dependence on the input current.

9. A current sensor according to claim 1, wherein the current sensor comprises a charge quantization circuit.

10. A device for performing a matrix-vector multiplication of a matrix with a vector, the device comprising:
    a crossbar array comprising:
        plurality of row lines;
        a plurality of column lines; and
        a plurality of junctions arranged between the plurality of row lines and the plurality of column lines, wherein each junction comprises a programmable resistive element and an access element for accessing the programmable resistive element;
    a signal generator configured to:
        apply programming signals to the resistive elements to program conductance values for the matrix-vector multiplication;
    a readout circuit configured to apply read voltages to the plurality of row lines of the crossbar array;
    wherein the readout circuit comprises one or more current sensors for reading out column currents of the plurality of column lines of the crossbar array;
    wherein each of the one or more current sensors comprises:
        a current controlled oscillator circuit configured to receive an input current and to provide an output signal having an output frequency which is dependent on the input current; and
        a feedforward circuit configured to adapt a reference voltage of the current controlled oscillator by adding a current dependent factor that scales linearly with on an instantaneous current value of the input current to the reference voltage.

11. A device according to claim 10, wherein the readout circuit is configured to apply the read voltages as pulse width modulated signals to the row lines of the crossbar array.

12. A device according to claim 10, wherein the readout circuit is configured to apply the read voltages as binary read pulse vectors to the row lines of the crossbar array.

13. A device as claimed in claim 10, wherein the resistive elements are one of Phase change memory (PCM) elements, Conductive bridge resistive memory elements, Metal-oxide resistive random access memory (RRAM) elements, Magneto-resistive random access memory (MRAM) elements, Ferroelectric random access memory (FeRAM) elements, optical memory elements, and a system device, comprising transistors, resistors, capacitors, and/or inductors, jointly emulating a behavior of a resistive memory element.

14. A method for performing a charge quantization, the method comprising:
    receiving, by a current controlled oscillator circuit, an input current;
    adapting, by a feedforward circuit, a reference voltage of the current controlled oscillator by adding a current dependent factor that scales linearly with an instantaneous current value of the input current to the reference voltage; and
    providing, by the current controlled oscillator, an output signal having an output frequency which is dependent on the input current.

15. A method according to claim 14 further comprising converting, by a counter circuit, the output frequency into a counter value.

16. A method according to claim 14, wherein the current dependent factor serves to adapt the reference voltage with a gain that cancels out delay factors between the input current and the output frequency.

17. A method according to claim 15 further comprising:
    performing, by the current controlled oscillator, a plurality of charge/discharge cycles of one or more integration capacitors; and
    counting, by the counter circuit, the plurality of charge/discharge cycles of the one or more integration capacitors.

18. A design structure tangibly embodied in a machine readable medium for designing, manufacturing, or testing an integrated circuit, the design structure comprising a current sensor comprising:

a current controlled oscillator circuit configured to receive an input current and to provide an output signal having an output frequency which is dependent on the input current; and a feedforward circuit configured to adapt a reference voltage of the current controlled oscillator by adding, to the reference voltage, a current dependent factor that scales linearly with an instantaneous current value of the input current.

* * * * *